United States Patent [19]
Han et al.

[11] Patent Number: 6,067,269
[45] Date of Patent: May 23, 2000

[54] SEMICONDUCTOR MEMORY DEVICE CAPABLE OF OPERATING AT A LOW POWER SUPPLY VOLTAGE

[75] Inventors: Gong-Heum Han, Choongchung-namdo; Cheol-Sung Park, Seoul; In-Cheol Shin, Suwon, all of Rep. of Korea

[73] Assignee: Samsung Electronics Co., Ltd., Rep. of Korea

[21] Appl. No.: 09/213,615

[22] Filed: Dec. 17, 1998

[30] Foreign Application Priority Data

Dec. 31, 1997 [KR] Rep. of Korea ............. 97-81010

[51] Int. Cl.$^7$ ........................................ G11C 7/00
[52] U.S. Cl. ............ 365/226; 365/227; 365/189.09; 365/230.06; 327/530; 327/538
[58] Field of Search .................. 365/227, 226, 365/222, 185.22

[56] References Cited

U.S. PATENT DOCUMENTS

| | | | |
|---|---|---|---|
| 5,264,743 | 11/1993 | Nakagome et al. | 307/473 |
| 5,371,705 | 12/1994 | Nakayama et al. | 365/189.09 |
| 5,490,116 | 2/1996 | Tobita et al. | 365/226 |
| 5,537,073 | 7/1996 | Arimoto | 327/546 |
| 5,555,215 | 9/1996 | Nakagome et al. | 365/226 |
| 5,754,075 | 5/1998 | Oh et al. | 327/536 |
| 5,798,976 | 8/1998 | Arimoto | 365/222 |
| 5,828,604 | 10/1998 | Kawai et al. | 365/185.22 |
| 5,877,651 | 3/1999 | Furutani | 327/538 |
| 5,901,102 | 5/1999 | Furutani | 365/226 |

*Primary Examiner*—Viet Q. Nguyen
*Attorney, Agent, or Firm*—Myers Bigel Sibley & Sajovec

[57] ABSTRACT

A semiconductor memory device is provided which uses an externally applied power supply voltage as its operating voltage. The device comprises plural memory cells each arranged in intersections of word lines and bit lines. The device further comprises an internal power supply voltage generating circuit for receiving the externally applied power supply voltage to generate an internal power supply voltage of a first level. Furthermore, the device has a plurality of word line drivers each connected to the word lines and to a power node for receiving the internal power supply voltage. The each of the word line drivers drives a corresponding word line with the internal power supply voltage in response to a word line selection signal. According to the semiconductor memory device of the present invention, a potential on the word line becomes maintained constantly at the operating voltage even though the external power supply voltage is increased. This prevents bit lines from becoming charged more than a required level owing to an external power supply voltage variation, so that signal swing width on each bit line and a write recovery time becomes maintained constantly. As a result, there is few or no power consumption in association with an external power supply voltage variation.

6 Claims, 4 Drawing Sheets

SEMICONDUCTOR MEMORY DEVICE CAPABLE OF OPERATING AT A LOW POWER SUPPLY VOLTAGE

FIELD OF THE INVENTION

The present invention relates to a semiconductor memory device and, more particularly to a semiconductor memory device using as its operating voltage an externally applied power supply voltage EVC (hereinafter, referred to as "an external power supply voltage").

BACKGROUND OF THE INVENTION

Recently, it is needed that semiconductor memory devices, which can operate at a low power supply voltage of, for example, 3.3 volts, dissipate low power and move quickly (have high operation speed). It is assumed that an internal power supply voltage generating circuit well known in the art is incorporated in the semiconductor memory devices supplied with the low power supply voltage and that either of a bipolar transistor and a MOS transistor is used as a driver circuit, particularly a word line driver (125, refer to FIG. 1).

Under this assumption, when the bipolar transistor is used as the word line driver, a word line connected thereto is supplied with an operating voltage dropped by a base-emitter voltage Vbe of the bipolar transistor. That is, the word line may be driven under the operating voltage. When the MOS transistor is used as the word line driver, an operation of the semiconductor memory device becomes instable owing to its low driving capacity.

Generally, in the semiconductor memory devices operating at the low power supply voltage, there is directly employed an external power supply voltage EVC as its operating voltage (that is, a power supply voltage).

However, when the external power supply voltage EVC is directly used as the operating voltage of the prior semiconductor memory device, there may be arisen problems to be described below if the external power supply voltage EVC is increased. Since the external power supply voltage thus increased is immediately supplied on the word line through the word line driver, a potential on the word line becomes higher than a required voltage, so that access transistors 104 and 105 (refer to FIG. 1), which are coupled to the word line, become much turned on. This makes current (or cell current) corresponding to a voltage thus changed flow onto either of bit lines BL and BLB (refer to FIG. 1) (this means that there is consumed more power than before the external power supply voltage is increased). As a result, signal width on each bit line becomes larger, so that a write recovery time $t_{WR}$ of AC characteristics of the conventional semiconductor memory device becomes longer (this means that its operation speed is reduced). Accordingly, when the external power supply voltage is directly applied to the word line driver, the aforementioned problems are arisen because of an external power supply voltage variation.

SUMMARY OF THE INVENTION

It is therefore an object of the present invention to provide a semiconductor memory device capable of preventing cell current from being increased even though an external power supply voltage becomes high, so that a write recovery time of AC characteristics becomes maintained constantly.

In order to attain the above objects, according to an aspect of the present invention, there is provided a semiconductor memory device which uses an externally applied power supply voltage as its operating voltage and which has plural memory cells each arranged in intersections of word lines and bit lines. The semiconductor memory device further comprises an internal power supply voltage generating circuit for receiving the externally applied power supply voltage to generate an internal power supply voltage of a first level; and a plurality of word line drivers each connected to the word lines and to a power node for receiving the internal power supply voltage, each for driving a corresponding word line with the internal power supply voltage in response to a word line selection signal.

According to another aspect of this invention, there is further provided a high voltage detecting circuit for generating a detection signal when the externally applied power supply voltage exceeds a voltage of a second level; and a driver connected to the power node, for supplying the power node with the externally applied power supply voltage in response to the detection signal, so that the word line corresponding to the word line selection signal is directly driven with the externally applied power supply voltage.

An novel semiconductor memory device of the present invention operates at a low power supply voltage of, for example, 3.3 volts, and employs an external power supply voltage as its operating voltage. The novel semiconductor memory device has one characteristic that a word line driver receives an internal power supply voltage from an internal power supply voltage generating circuit as its operating voltage and then drives a word line during an normal mode of operation (for example, a reading or a writing). And, the device has the other characteristic that the word line driver receives the external power supply voltage from a driver controlled by a high voltage detecting circuit and then drives the word line at the external power supply voltage (or a burn_in test voltage) of, for example, about 5 volts during a test mode of operation.

According to this word line voltage control scheme, a potential on the word line becomes maintained constantly at the operating voltage even though the external power supply voltage is increased. This prevents bit lines from becoming charged more than a required level owing to an external power supply voltage variation, so that signal swing width on each bit line and a write recovery time $t_{WR}$ becomes maintained constantly. As a result, there is few or no power consumption in association with an external power supply voltage variation.

DESCRIPTION OF THE PREFERRED EMBODIMENTS

A preferred embodiment according to the present invention will be described below with reference to the accompanying drawings.

Figure 1:
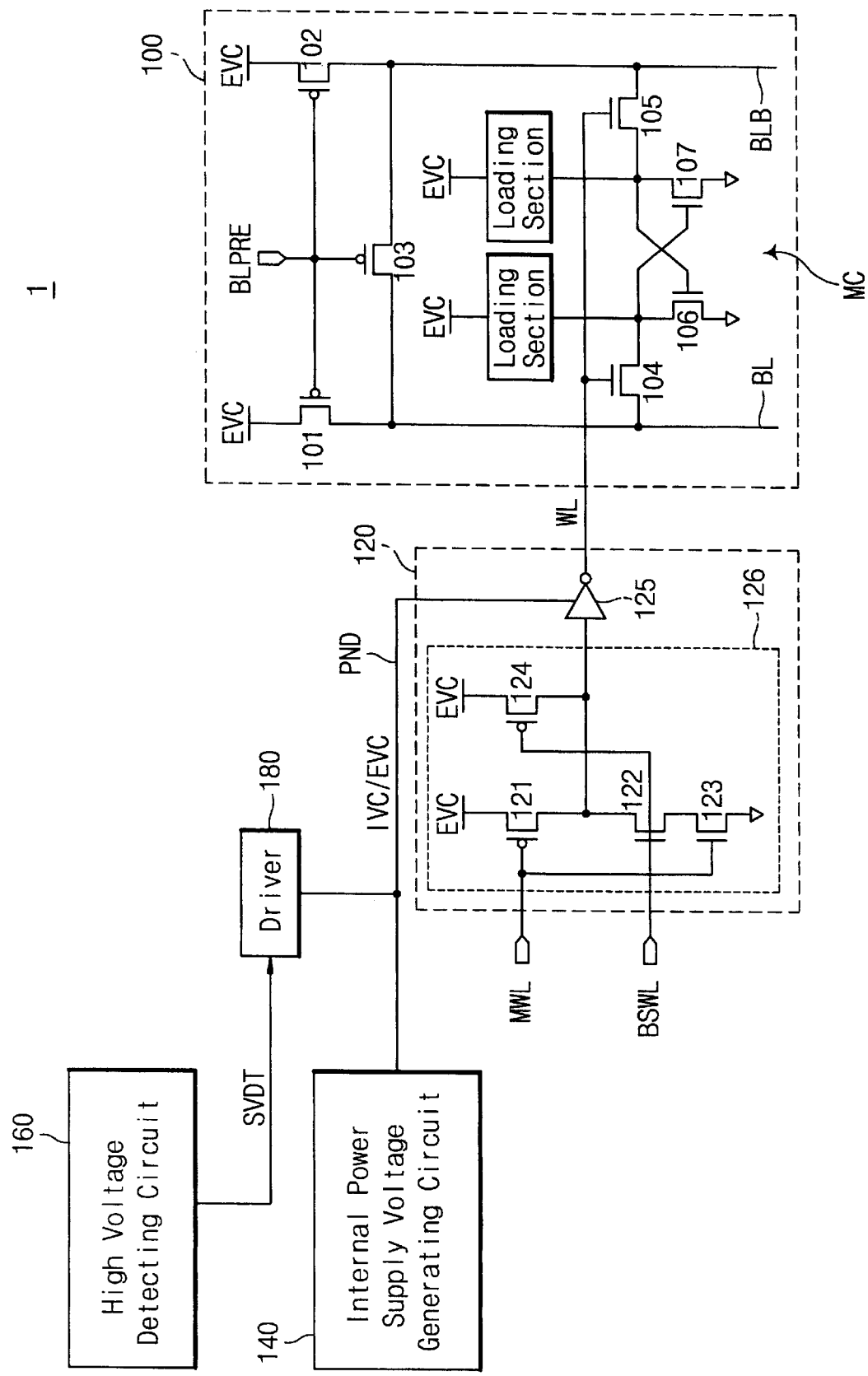
FIG. 1 is a block diagram showing a semiconductor memory device according to the present invention.
Figure 2:
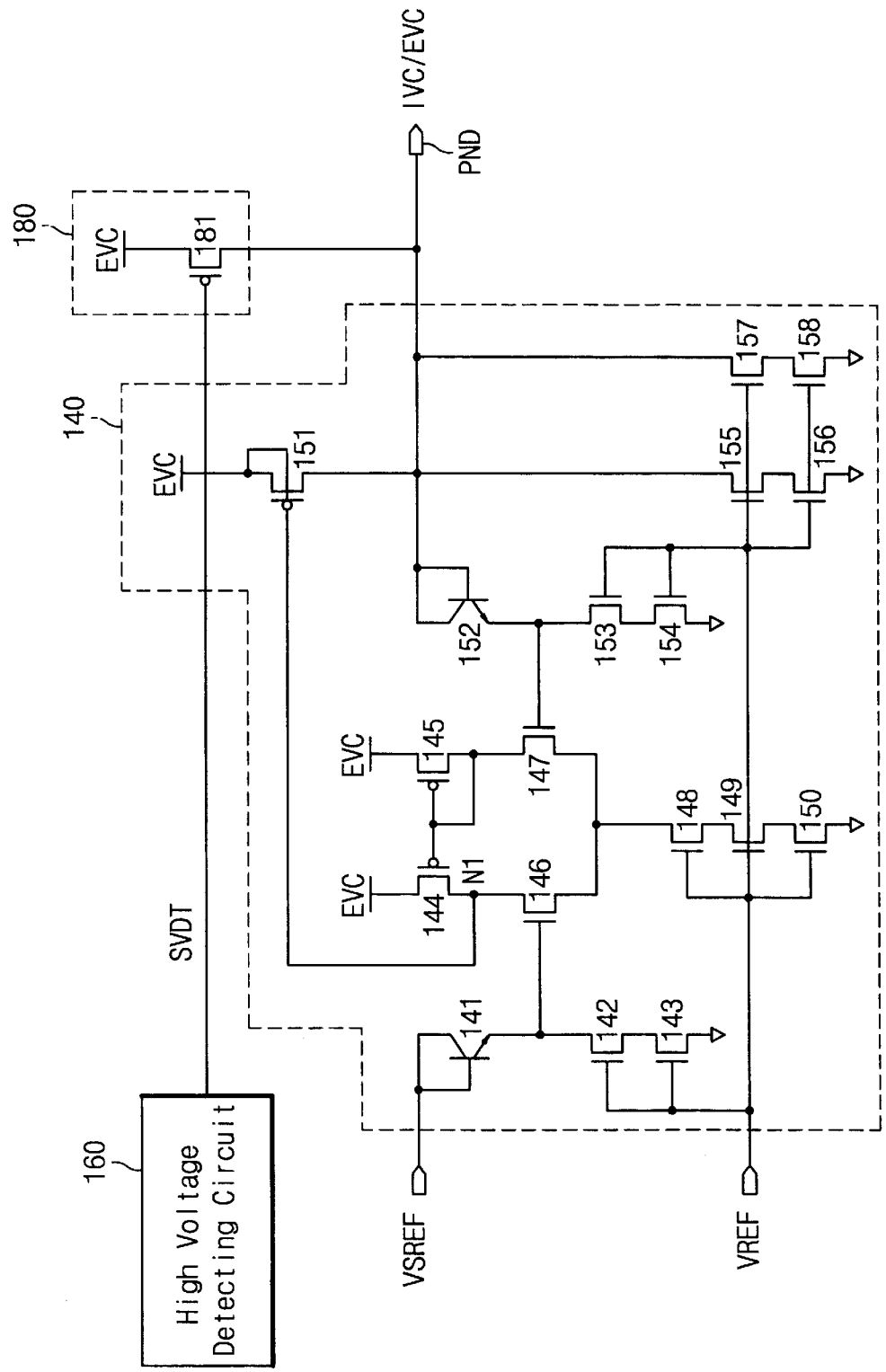
FIG. 2 shows a detailed circuit diagram of an internal power supply voltage generating circuit and a driver in FIG. 1 according to the preferred embodiment of the present invention.

FIG. 1 is a block diagram showing a semiconductor memory device according to the present invention. FIG. 2 shows a detailed circuit diagram of an internal power supply voltage generating circuit and a driver in FIG. 1 according to the preferred embodiment of the present invention.

Referring to FIG. 1, in the semiconductor memory device 1 according to the present invention, an memory cell array 100 is provided which has static random access memory cells MC arranged in intersections of word lines extending to a row direction and bit lines extending to a column direction. For ease of illustration, only one memory cell MC is depicted in association with one word line WL and a pair of bit lines BL and BLB.

To the word line WL, a word line selecting circuit 120 is connected which is comprised of a word line decoder 126 and a word line driver 125. The word line decoder 126 consists of two PMOS transistors 121 and 124 and two NMOS transistors 122 and 123, and acts as a NAND gate circuit for mixing input signals MWL and BSWL. The word line driver 125 is connected to the word line WL and to a power node PND, and is constituted of an inverter. The word line driver 125 responds to output (or a word line selection signal) from the NAND gate circuit 126, and then supplies the word line WL with a voltage IVC/EVC on the power node PND.

With reference to FIG. 1, the device 1 further comprises an internal power supply voltage generating circuit 140 which generates an internal power supply voltage IVC by using the external power supply voltage EVC. The internal power supply voltage generating circuit 140 according to the preferred embodiment is illustrated in detail in FIG. 2, which is well known to ones of ordinary skill in the art, and a configuration description thereof is thus omitted. It is designed so that when the external power supply voltage EVC is at a voltage less than a predetermined voltage, for example, about 3 volts, the internal power supply voltage IVC follows the external power supply voltage EVC. And, it is designed so that when the voltage EVC exceeds the voltage of about 3 volts, the internal power supply voltage IVC has a constant voltage of about 3 volts.

Referring again to FIG. 1, in the semiconductor memory device 1, there are provided a high voltage detecting circuit 160 and a driver 180. The high voltage detecting circuit 160 receives the external power supply voltage EVC and detects whether the voltage EVC exceeds a voltage (for example, a burn__in test voltage) of about 5 through 5.5 volts. If so, the circuit 160 generates as the detection result a detection signal SVDT of a low level. Otherwise, the circuit 160 generates as the detection result the detection signal SVDT of a high level. It is obvious to ones skilled in the art that the high voltage detecting circuit 160 can be constituted of a comparator although not shown. When the detection signal SVDT is at a low level, the driver 180 supplies the external power supply voltage EVC onto the power node PND, so that the word line WL is driven with the external power supply voltage EVC of the burn__in test voltage. As illustrated in FIG. 2, the driver 180 consists of a PMOS transistor 181 which has a gate receiving the detection signal SVDT, a source connected to the external power supply voltage EVC, and a drain coupled to the power node PND for transferring the voltage IVC/EVC.

Figure 3A:
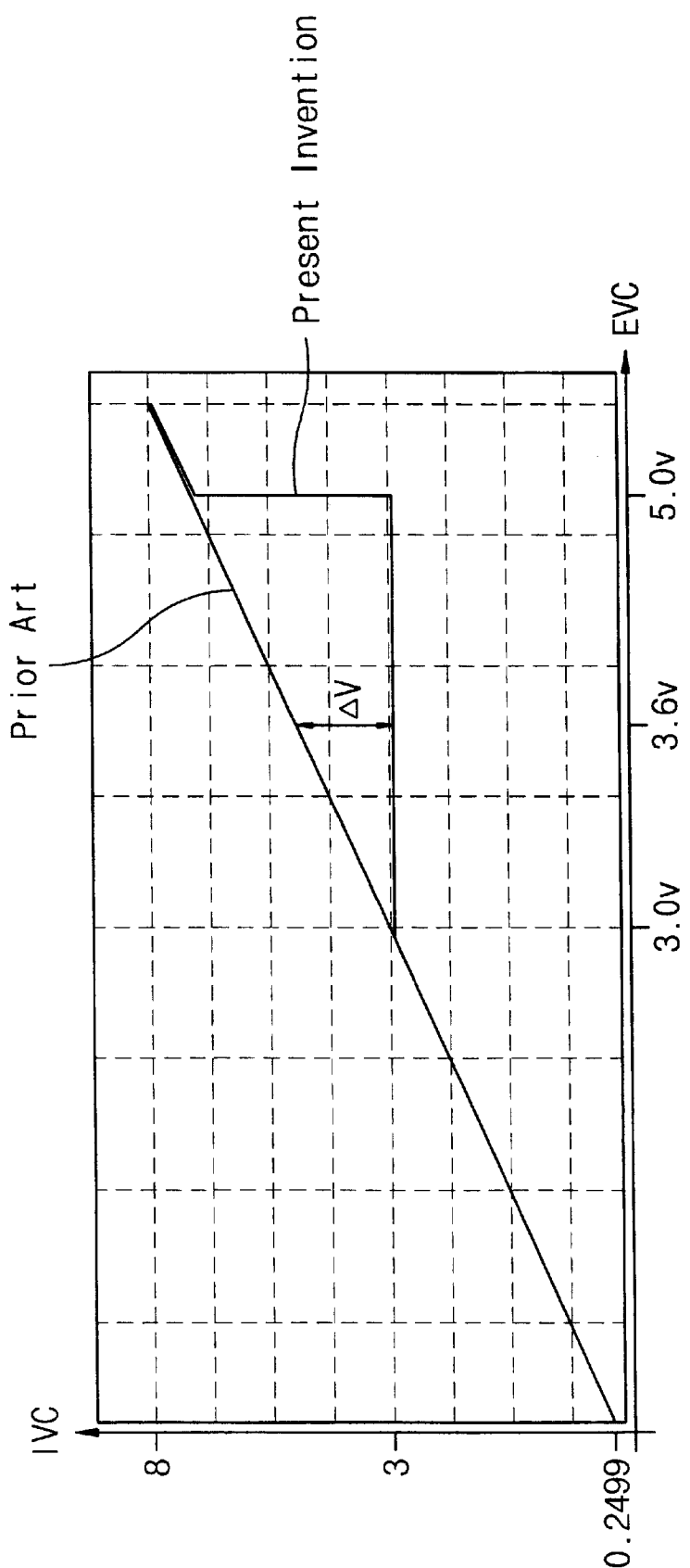
FIG. 3A is a diagram for comparing output voltages from each word line driver according to the prior art and the present invention.
Figure 3B:
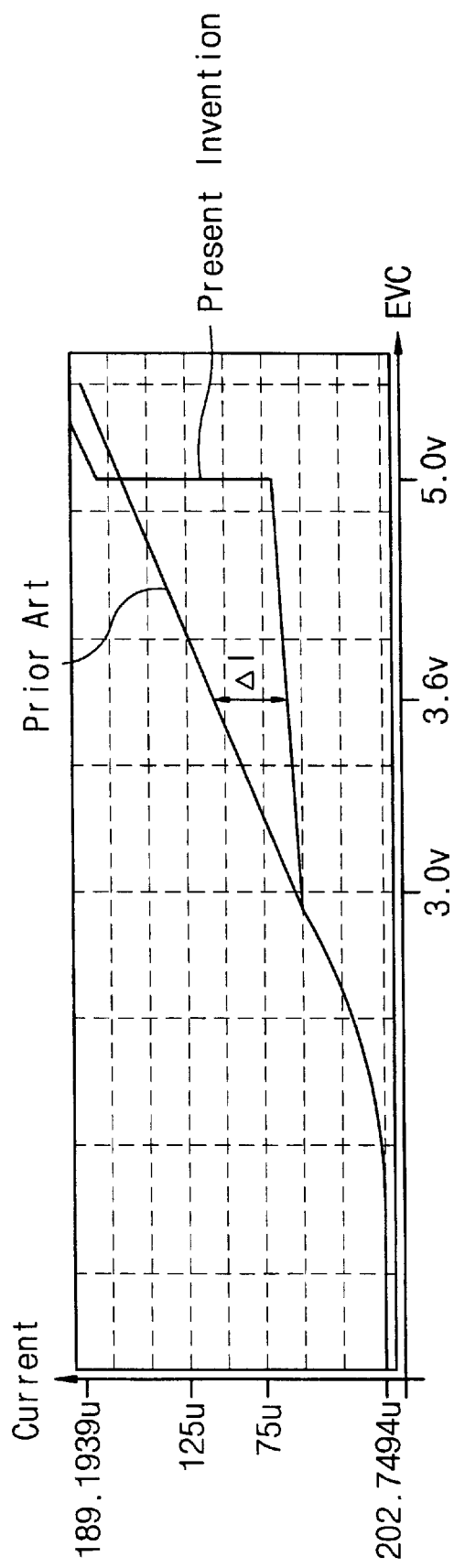
FIG. 3B is a diagram for comparing cell current consumption according to the prior art and the present invention.

FIG. 3A is a diagram for comparing output voltages from each word line driver according to the prior art and the present invention, and FIG. 3B is a diagram for comparing cell current consumption according to the prior art and the present invention.

An operation of the semiconductor memory device 1 according to the present invention will be expressed with reference to FIGS. 1 through 3B.

When previous decoded signals MWL and BSWL are activated at the high level, the word line driver 125 supplies the word line WL with a voltage on the power node PND in response to an output (or a word line selection signal) from the word line decoder 126. If the detection signal SVDT is at a high level, the power node PND has a level of the internal power supply voltage IVC from the internal power supply voltage generating circuit 140. That is, when the semiconductor memory device 1 is at an normal mode of operation (for example, a reading or a writing), the word line WL is supplied with the internal power supply voltage IVC constantly maintained regardless of the external power supply voltage EVC variation.

For example, assuming that a range of the operating voltage of the semiconductor memory device 1 is between 3 volts through 3.6 volts. Under this assumption, when the external power supply voltage EVC increases until the 3.6 volts, a difference $\Delta V$ between word line voltages according to the prior art and the present invention is arisen as illustrated in FIG. 3A. This means that the semiconductor memory device of the prior art consumes more cell current $\Delta I$ corresponding to the voltage difference $\Delta V$ than the present invention.

When the external power supply voltage EVC exceeds a voltage (for example, a burn__in test voltage) of about 5 volts, the high voltage detecting circuit 160 generates the detection signal SVDT of a low level, so that the PMOS transistor 181 of the driver 180 is turned on. This makes the power node PND have a level of the external power supply voltage EVC through the driver 180. Accordingly, the word line WL is driven at the level of the external power supply voltage EVC through the word line driver 125. Therefore, during a burn__in test mode of operation, the high voltage of about 5 volts or more is directly provided onto the word line WL through the drivers 180 and 125.

It should be seen that the internal power supply voltage IVC becomes maintained at about 3 volts although the external power supply voltage EVC increases as shown in FIG. 3A. It means that a potential on the word line WL is made constantly regardless of an external power supply voltage EVC variation. Unlike the prior art, the semiconductor memory device 1 of the present invention consumes only slight cell current with regard to a variation of the external power supply voltage EVC. As a result, current consumption is reduced with regard to the prior art (that is, there is few or no power consumption in association with an external power supply voltage variation), and prior problems, such as an increase of signal swing width and an elongation of a write recovery time, are prevented.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A semiconductor memory device which uses an externally applied power supply voltage as its operating voltage and which has a plurality of memory cells arranged at intersections of word lines and bit lines in the semiconductor memory device, said device comprising:

an internal power supply voltage generating circuit that receives the externally applied power supply voltage to generate an internal power supply voltage of a first level on a power node;

a high voltage detecting circuit, connected to the externally applied power supply voltage, that provides a high voltage detection signal if the externally applied power supply voltage level exceeds a second level greater than the first level; and a driver connected to the high voltage detecting circuit and to the power node, that applies the externally applied power supply voltage to the power node responsive to the high voltage detection signal.

2. The semiconductor memory device according to claim 1, wherein each word line driver comprises an inverter.

3. The semiconductor memory device according to claim 1, wherein said first level is a level of about 3 volts.

4. A semiconductor memory device which uses an externally applied power supply voltage as its operating voltage and which has plural memory cells each arranged in intersections of word lines and bit lines, said device further comprising:

an internal power supply voltage generating circuit for receiving the externally applied power supply voltage to generate an internal power supply voltage of a first level;

a plurality of word line drivers each connected to the word lines and to a power node for receiving the internal power supply voltage, each for driving a corresponding word line with the internal power supply voltage in response to a word line selection signal;

a high voltage detecting circuit for generating a detection signal when the externally applied power supply voltage exceeds a voltage of a second level; and a driver connected to the power node, for supplying the power node with the externally applied power supply voltage in response to the detection signal, so that the word line corresponding to the word line selection signal is directly driven with the externally applied power supply voltage.

5. The semiconductor memory device according to claim 4, wherein said second level is a level of about 5 volts through 5.5 volts.

6. The semiconductor memory device according to claim 4, wherein said driver comprises a PMOS transistor which has a gate receiving the detection signal, a source connected to the externally applied power supply voltage, and a drain connected to the power node.

* * * * *